United States Patent [19]
Gerner et al.

[11] Patent Number: 5,698,865
[45] Date of Patent: Dec. 16, 1997

[54] LIGHT-EMITTING DIODE

[75] Inventors: Jochen Gerner, Wiesloch; Klaus Gillessen, Heilbronn, both of Germany

[73] Assignee: Temic Telefunken microelectronic GmbH, Heilbronn, Germany

[21] Appl. No.: 631,330

[22] Filed: Apr. 12, 1996

[30] Foreign Application Priority Data

May 13, 1995 [DE] Germany .................. 195 17 697.9

[51] Int. Cl.$^6$ .................................................. H01L 33/00
[52] U.S. Cl. ..................... 257/94; 257/99; 257/103
[58] Field of Search .................. 257/94, 81, 99, 257/473

[56] References Cited

U.S. PATENT DOCUMENTS

| | | |
|---|---|---|
| 4,499,656 | 2/1985 | Fabian et al. ............ 29/576 E |
| 4,864,370 | 9/1989 | Gaw et al. . |
| 5,049,954 | 9/1991 | Shimada et al. ............ 357/15 |
| 5,309,001 | 5/1994 | Watanabi ............ 257/99 |
| 5,359,209 | 10/1994 | Huang ............ 257/94 |

FOREIGN PATENT DOCUMENTS 0544512  6/1993  European Pat. Off. .
4017632  12/1990  Germany .

Primary Examiner—Sara W. Crane
Assistant Examiner—Douglas A. Wille
Attorney, Agent, or Firm—Spencer & Frank

[57] ABSTRACT

The light-emitting diode consists of a substrate and a light-emission-generating layer located on the substrate and embedded between the cladding layers of a double heterostructure. On the top cladding layer, a current diffusion layer is located on which there is a further contact layer structure. The current diffusion layer is sufficiently thin so as to hardly absorb any light-emission. Thus, it can be economically produced by means of the MOCVD process. At the same time, the contact layer structure is provided with branched and finger-type electrodes for distributing the current together with the current diffusion layer onto the surface of the light-emission-generating layer. However, the structural size of the branched and finger-type electrodes is selected such that these can still be manufactured by the standard processes used in LED manufacture.

24 Claims, 2 Drawing Sheets

LIGHT-EMITTING DIODE

BACKGROUND OF THE INVENTION

Based on the III-V semiconductor InGaAlP, light-emitting diodes were developed in recent years which radiate light in colors ranging from orange-red to green. These diodes normally consist of a GaAs substrate which is provided with a full surface electrical contact on the back. At the front, the active structure from the material system $In_{(1-(x+y))}Ga_xAl_yP$ is located. The composition of the active structure is selected such that its lattice constant is adapted to the GaAs substrate, that is x+y=0.52. This corresponds to an indium content of 48%. InGaAlP features direct band transitions with a high quantum efficiency in the range $0 \leq y \leq 0.3$. With $E_{gap} \geq 2.0$ to 2.2 eV and corresponding emission wavelengths, the band gap lies within the range from 620 to 560 nm. The active structure is normally implemented as a double heterostructure on the GaAs substrate. In addition, a layer for current diffusion is arranged underneath the top surface contact areas on the double heterostructure.

From DE 40 17 632 A1, such a diode made of InGaAlP, featuring a light-emitting layer embedded in between two cladding layers of a double heterostructure, is known. On the top cladding layer, a current diffusion layer is provided which ensures an even light emission across the entire surface of the diode. Without this current diffusion layer, light emission would remain limited to the area directly underneath the front contact. The known current diffusion layer consists of $Ga_{1-x}Al_xAs$, with the aluminum content x being selected such that the layer possesses a maximum transparency for the emission generated. For the shorter wavelengths which can still be generated by means of the active structure, however, the aluminum content must be selected to be so high that the current diffusion layer will no longer have a sufficient degree of moisture stability and thus be no longer suitable for use in a series product. A further disadvantage is that the current diffusion layer—in contrast to the other diode structure layers—cannot be produced by means of the MOCVD process. Due to its thickness required for current diffusion, growth by means of a MOCVD process would require processing times which are too long, and therefore this process cannot be used economically.

From EP 0 544 512 A1, a light-emitting diode structure made of InGaAlP is known where, on a GaAs substrate, the light-emitting layer is located between two cladding layers of a double heterostructure, and a finely branched contact structure is located directly on the top cladding layer with which it has direct electrical contact. A current diffusion layer is not provided here. Current distribution onto the diode surface is effected by the fine branching of the contact structure. The disadvantage here is that a very great technological effort is required in order to manufacture the fine structures of the contact arrangement. If one considers that today's LED chips have an edge length of not more than 300 µm, it becomes clear that technologies must be used here which, owing to the high investment costs, are reserved for highly integrated circuits. It is very difficult to use this equipment for the economically viable production of for luminescence diodes. Moreover, the surfaces of compound semiconductor wafers for luminescence diodes—in contrast to those of silicon wafers for circuits—generally contain a great many impurities which make it even more difficult to use these technologies.

SUMMARY OF THE INVENTION

The object of the invention therefore is to provide a light-emitting diode whose structure allows an improved luminous efficiency. This object is provided by a light-emitting diode comprising a substrate, a light-emission-generating layer embedded between the cladding layers of a double heterostructure and located on the substrate, a current diffusion layer located on the top cladding layer and a contact layer structure disposed on the current diffusion layer there is, wherein the current diffusion layer is sufficiently thin to absorb hardly any light-emission and to allow economic manufacture by means of the MOCVD process, and wherein the contact layer structure features branched and finger-type electrodes, which, together with the current diffusion layer, distribute the current in sufficient measure across the surface area of the light-emission-generating layer. Further advantageous applications of the light-emitting diode will result from the features of dependent sub-claims.

The light-emitting diode consists of a substrate and a light-emission-generating layer located on the substrate and embedded between the cladding layers of a double heterostructure. On the top cladding layer, a current diffusion layer is located on which there is a further contact layer structure. The current diffusion layer is sufficiently thin so as to hardly absorb any light-emission. Thus, it can be economically produced by means of the MOCVD process. At the same time, the contact layer structure is provided with branched and finger-type electrodes for distributing the current together with the current diffusion layer onto the surface of the light-emission-generating layer. However, the structural size of the branched and finger-type electrodes is selected such that these can still be manufactured by the standard processes used in LED manufacture.

Advantageously, the substrate consists of GaAs on which a buffer layer and the double heterostructure made from InGaAlP are located. The precise structure and the composition of these layers is dependent, e.g., on the wavelength of the light which is to be generated with the light-emitting diode.

The current diffusion layer has a thickness ranging from 50 to 500 nm. This thickness range can be manufactured economically by means of MOCVD processes. Therefore, in contrast to the known thick current diffusion layers, this current diffusion layer can thus be generated together with the active structure. For the stated thickness of the current diffusion layer, no significant absorption occurs as yet during the passage of the light-emission. It is therefore not necessary to select the material in respect of its absorption characteristics relative to the light-emission generated. Preferably, the current diffusion layer consists of GaAs or GaAlAs with an aluminum content of less than 60%. This layer features doping in the range from $1 \cdot 10^{18}$ to $2 \cdot 10^{19}$ $cm^{-3}$. In an advantageous application, doping will be approximately $1 \cdot 10^{19}$ $cm^{-3}$. The current diffusion layer has a layer resistance $R_S \leq 250 \, \Omega$.

The contact layer structure features finger-type electrodes branched toward the outside, as well as a central surface area for bonding. The branched and finger-type electrodes of the contact layer structure consist of a gold alloy. Advantageously, this gold alloy consists of AuZn, AuBe, AuGe, or AuGeNi.

The branched and finger-type electrodes of the contact layer structure have a thickness in the range from 0.1 to 1 µm. In an advantageous application, the branched and finger-type electrodes have a thickness of 0.5 µm.

The branched and finger-type electrodes of the contact layer structure have a width in the range from 4 to 12 µm. In an advantageous application, the branched and finger-type electrodes of the contact layer structure have a width of approximately 8 μm.

The degree of covering provided by the branched and finger-type electrodes of the contact layer structure to the current diffusion layer will be between 5 and 25%. In an advantageous application, the degree of covering provided by the branched and finger-type electrodes of the contact layer structure to the current diffusion layer will be approximately 20%.

The central surface area for bonding is insulated from the current diffusion layer. In an initial design, an insulating layer is inserted between the current diffusion layer and the central surface area for bonding. Advantageously, the insulating layer consists of silicon dioxide.

In another design, insulation of the central surface area for bonding from the current diffusion layer is effected by a reverse biased Schottky contact. In an initial advantageous application, the Schottky contact is made up of a double layer made of Ni—Au, which features a thickness in the range from 1 to 2.5 μm. The first sublayer of the double layer has an approximate thickness of 5 nm and consists of Ni. The second sublayer consists of Au and has an approximate thickness of 1 μm.

In another design, the central surface area for bonding consists of a double layer made of TiWN—Al with a thickness in the range from 2 to 4.5 μm. The first sublayer has an approximate thickness of 0.25 μm and consists of TiWN. The second sublayer consists of aluminum and has an approximate thickness of 3 μm.

DESCRIPTION OF THE PREFERRED EMBODIMENTS

In the following, the invention will be elucidated using embodiments and the illustrations provided by the figures described above.

Figure 1:
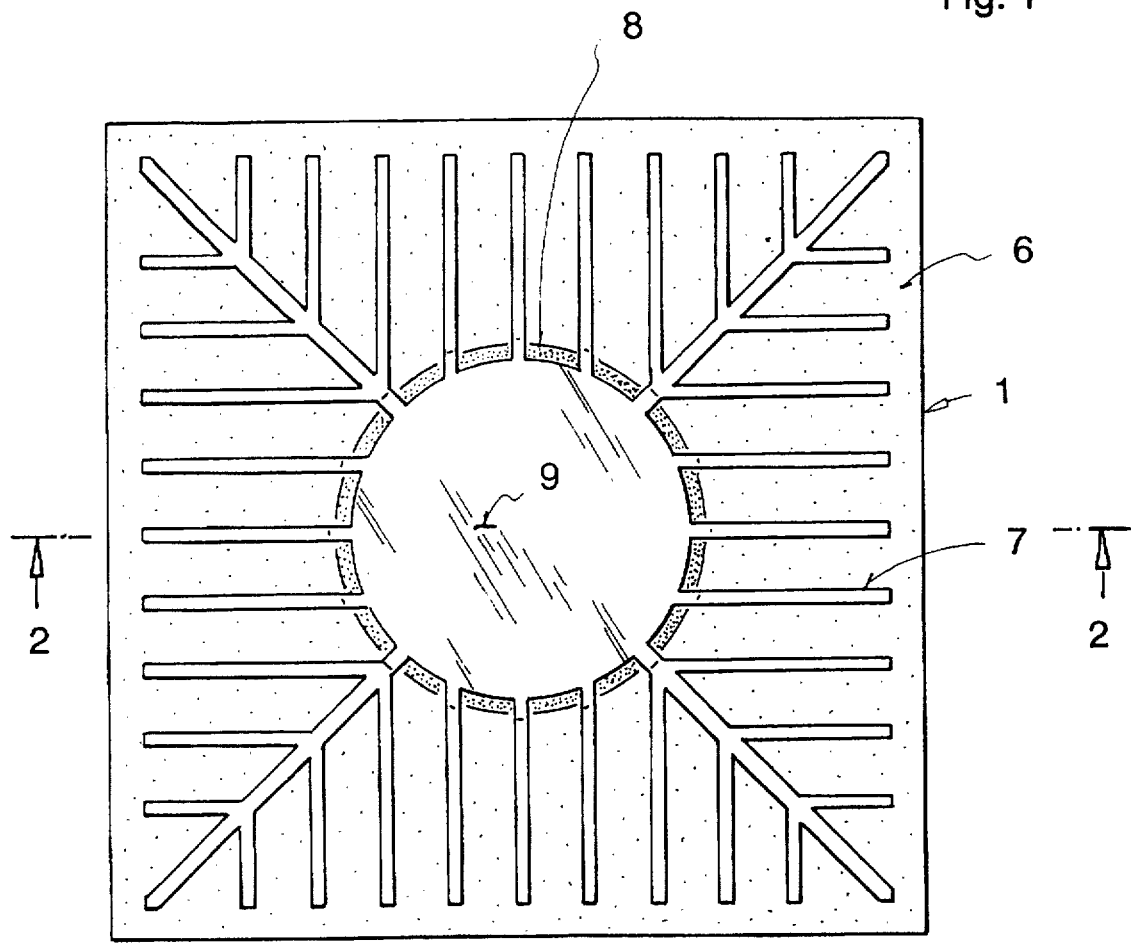
FIG. 1 shows a first embodiment of the light-emitting diode in top view.

FIG. 1 illustrates a first embodiment of a light-emitting diode. On a current diffusion layer 6, the contact layer structure 7, 9 with its branched and finger-type electrodes 7, as well as its central surface area for bonding 9, is located. Together with the current diffusion layer, the branched and finger-type electrodes form an ohmic contact. The central surface area for bonding 9, however, is insulated from the current diffusion layer 6. In the present embodiment, insulation is effected by means of a silicon dioxide layer 8 located in the area of the central surface for bonding 9 between the metallization of the contact layer structure and the current diffusion layer 8. Shape and size of the insulating silicon dioxide layer 8 essentially correspond to the central surface area for bonding 9.

The combination consisting of the branched and finger-type electrodes of the contact layer structure and the "thin" current diffusion layer 6 enables an even current diffusion across the entire surface of the light-emitting layer. From this, only the central surface area for bonding 9 is excepted. Due to this area being insulated, there will be no current there, and no light-emission will be generated. In any case, the light-emitting layer 4 is screened here by the central surface area 9. On the central surface area for bonding, contacting the front of the light-emitting diode will be effected by means of a wire-bond.

Figure 2:
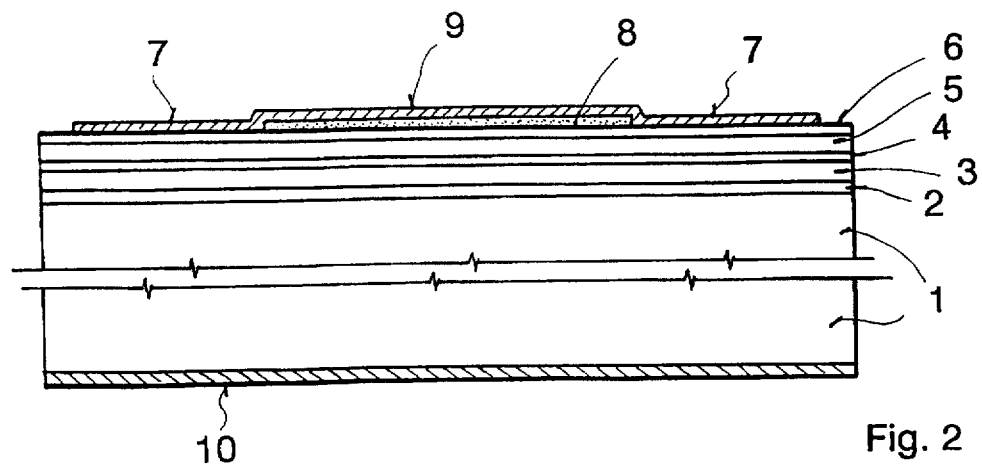
FIG. 2 shows a cross-section through the light-emitting diode of FIG. 1, along the cutting line 2—2.

FIG. 2 illustrates a cross-section through the light-emitting diode of FIG. 1 along the cutting line 2—2 shown in that figure. On the substrate 1 made of GaAs, first a buffer layer 2, then the double heterostructure comprising the bottom cladding layer 3, the light-emission-generating layer 4, and the top cladding layer 5, are located. The buffer layer 2 and the double heterostructure layers 3, 4, 5 consist of the material system InGaAlP. The precise structure, composition and doping of the layers are dependent on the required wavelength of the light-emission to be generated and need to be appropriately adapted in each individual case.

On the top cladding layer 5 of the double heterostructure, the current diffusion layer 6 is located. Its thickness ranges between 50 and 500 nm so that either no, or only very low, absorption of the light-emission occurs when passing through this layer. The material which the current diffusion layer is made up of, therefore, need not be selected in respect of absorption characteristics. As preferred materials, GaAs or GaAlAs with an aluminum content of less than 60% have been identified.

The low thickness of the current diffusion layer 6 allows the layer 6 to be manufactured by means of the MOCVD process, which is also used for the production of the double heterostructure.

On the current diffusion layer 6, the contact layer structure 7, 9 with its branched and finger-type electrodes 7 and the central surface area for bonding 9, is located. The contact layer structure is in ohmic contact with the current diffusion layer in the area of the branched and finger-type electrodes. The central surface area is separated from the current diffusion layer by means of an insulating layer 9 consisting of silicon dioxide. In the present embodiment, the metallization of the contact layer structure consists of a gold alloy in the area of the branched and finger-type electrodes as well as in the central surface area. Depending on the conductivity type of the current diffusion layer, the material of the contact layer structure consists of an AuZn or AuBe, or an AuGe or AuGeNi, alloy.

The width of the branched and finger-type electrodes 7 is approximately 8 μm. This yields a typical degree of covering—for that part of the surface area not covered by the central surface area—which is approximately 20%.

Figure 3:
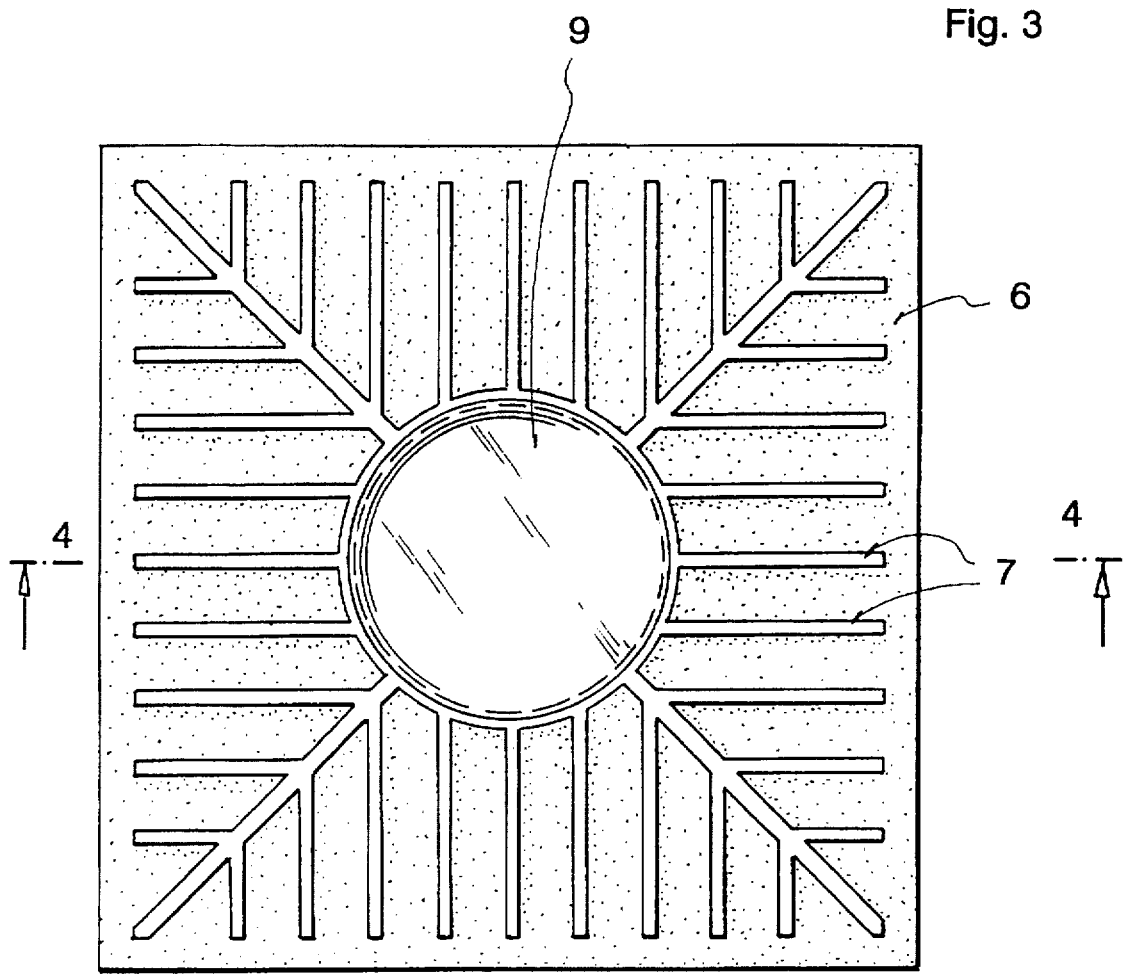
FIG. 3 shows a second embodiment of the light-emitting diode in top view.
Figure 4:
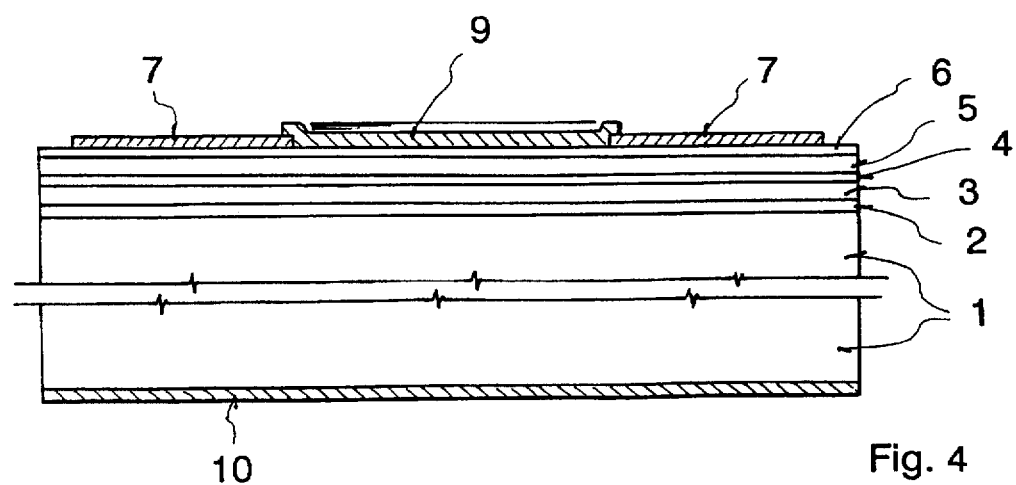
FIG. 4 shows a cross-section through the light-emitting diode of FIG. 3, along the cutting line 4—4.

FIG. 3 shows a second embodiment of a light-emitting diode according to the invention, and FIG. 4 shows the cross-section along the line designated in FIG. 3 as 4—4. Here, the structure of the diode mainly corresponds to the first embodiment. Differences result from the way in which the central surface area is insulated from the current diffusion layer. On the current diffusion layer 6 located according to the first embodiment on the top cladding layer 5 of the double heterostructure, the branched and finger-type electrodes 7 are arranged. These consist of a gold alloy and form an ohmic contact with the current diffusion layer 6. The central surface area for bonding 9 is formed by a second metal layer which, together with the current diffusion layer 6 situated underneath, makes up a reverse biased Schottky contact. The second metal layer 6 is designed as a double layer and consists either of Ni—Au or TiWN—Al. The first sublayer made of Ni or TiWN is located directly on the current diffusion layer and, together with this layer, forms the Schottky contact. In the case of Ni, this first sublayer has a thickness of approximately 5 nm, and, in the case of TiWN, it has a thickness of 250 nm. As a second sublayer, Au is then arranged on the Ni sublayer, or Al on the TiWN sublayer. As the surface is used for bonding, the second sublayer is relatively thick; for Au approximately 1 µm, and for Al approximately 2 to 4 µm.

In the second embodiment, too, the current will be effectively distributed onto the surface of the light-emitting layer by means of the combination of branched and finger-type electrodes, together with a thin current diffusion layer. The insulation of the central surface area for bonding the current diffusion layer prevents light-generation to concentrate underneath the central surface area, which light-generation would in any case be screened by that area.

A light-emitting diode according to the second embodiment may be manufactured as described below. Following production of the double heterostructure containing the light-emitting layer, a thin layer for current diffusion 6 will be generated on the top cladding layer 5 of the double heterostructure. This layer 6 has a thickness ranging from 50 to 500 nm and features a charge carrier concentration in the range from $1 \cdot 10^{18}$ to $2 \cdot 10^{19}$ cm$^3$. On to the current diffusion layer, a contact layer structure 7.9 complete with branched and finger-type electrodes will be applied. Initially, the central surface area 9 will be left free. Depending on the conductivity type of the current diffusion layer, the contact layer structure preferably consists of an AuZn or AuBe or an AuGe or AuGeNi alloy. By means of a tempering process, an ohmic contact is formed between the gold alloy and the current diffusion layer. Subsequently, a second metal layer will be applied to the central surface area, which, together with the current diffusion layer, will form a non-ohmic Schottky contact and be electrically connected to the branched metal layer. The second metal layer consists of a thin adhesion layer made of nickel, with a thickness of approximately 5 nm, as well as gold layer with a thickness between 1 and 2.5 µm. The reason for the gold layer being applied in such a thickness is to enable a wire-bond to be effected on this layer at a later stage. This sequence of layers will not be tempered. The gold layer can also be implemented more thinly (typically 0.25µ) and reinforced by a double layer consisting of TiWN and aluminum. This sequence of layers will not be tempered either.

The light-emitting diode generated in this way is characterized by a high luminous efficiency and a long service life.

What is claimed is:

1. Light-emitting diode comprising a substrate, a light-emission-generating layer embedded between respective cladding layers of a double heterostructure and located on the substrate, a current diffusion layer located on the top cladding layer, on which current diffusion layer there is a contact layer structure, wherein the current diffusion layer has a thickness in the range of from approximately 50–500 nm and absorbs hardly any light-emission, and wherein the contact layer structure has branched and finger-type electrodes which extend outwardly from a control area for bonding and which ohmically contact the current diffusion layer to distribute the current across the surface of the light-emission-generating layer, said branched and finger-type electrodes having a width in the range of approximately 4–12 µm and with the degree of coverage of the current diffusion layer by the branched and finger-type electrodes being in the range of approximately 5–25%.

2. Light-emitting diode according to claim 1 wherein the double heterostructure consists of InGaAlP.

3. Light-emitting diode according to claim 2 wherein the current diffusion layer consists of GaAs.

4. Light-emitting diode according to claim 1 wherein the current diffusion layer consists of $Ga_{1-x}Al_xAs$, with $x \leq 0.6$.

5. Light-emitting diode according to claim 1 wherein the current diffusion layer has a thickness of approximately 100 nm.

6. Light-emitting diode according to claim 1 wherein the current diffusion layer has a doping within the range from $1 \cdot 10^{18}$ cm$^{-3}$ to $2 \cdot 10^{19}$ cm$^{-3}$.

7. Light-emitting diode according to claim 6 wherein the current diffusion layer has a doping of approximately $1 \cdot 10^{19}$ cm$^{-3}$.

8. Light-emitting diode according to claim 1 wherein the current diffusion layer has a layer resistance equal to or less than 250 Ω.

9. Light-emitting diode according to claim 1 wherein the branched and finger-type electrodes of the contact layer structure consist of a gold alloy.

10. Light-emitting diode according to claim 9 wherein the gold alloy has been taken from the group comprising AuZn, AuBe, AuGe, and AuGeNi.

11. Light-emitting diode according to claim 9 wherein the branched and finger-type electrodes of the contact layer structure have a thickness in the range from 0.1 to 1 µm.

12. Light-emitting diode according to claim 11 wherein the branched and finger-type electrodes of the contact layer structure have a thickness of 0.5 µm.

13. Light-emitting diode according to claim 1 wherein the branched and finger-type electrodes of the contact layer structure have a width of 8 µm.

14. Light-emitting diode according to claim 1 wherein the degree of covering in relation to the current diffusion layer covered by the branched and finger-type electrodes of the contact layer structure is 20%.

15. Light-emitting diode according to claim 1 wherein the central surface area for bonding is insulated from the current diffusion layer.

16. Light-emitting diode according to claim 15 wherein an insulating layer is inserted between the current diffusion layer and the central surface area for bonding.

17. Light-emitting diode according to claim 16 wherein the insulating layer consists of $SiO_2$.

18. Light-emitting diode according to claim 15 wherein the central surface area for bonding is insulated from the current diffusion layer by means of a reverse biased Schottky barrier.

19. Light-emitting diode according to claim 18 wherein the central surface area for bonding consists of a double layer made of NiAu.

20. Light-emitting diode according to claim 19 wherein the central surface area for bonding has a thickness in the range of 1 to 2.5 µm.

21. Light-emitting diode according to claim 20 wherein the first sublayer of the double layer consists of Ni and has a thickness of approximately 5 nm, and wherein the second sublayer consists of Au and has a thickness of approximately 1 µm.

22. Light-emitting diode according to claim 18 wherein the central surface area for bonding consists of a double layer made of TiWN—Au.

23. Light-emitting diode according to claim 22 wherein the central surface area for bonding has a thickness within the range from 2 to 4.5 µm.

24. Light-emitting diode according to claim 23 wherein the first sublayer of the double layer consists of TiWN and has a thickness of approximately 0.25 µm, and wherein the second sublayer consists of Al and has a thickness of approximately 3 µm.

* * * * *